United States Patent [19]
Henderson et al.

[11] Patent Number: 5,274,584
[45] Date of Patent: Dec. 28, 1993

[54] SOLID STATE MEMORY DEVICE HAVING OPTICAL DATA CONNECTIONS

[75] Inventors: Watson R. Henderson, Broomfield; Michael S. Kelly, Westminster; Michael L. Leonhardt, Longmont; Floyd G. Paurus; Archibald W. Smith, both of Boulder; Stanley R. Szerlip, Longmont, all of Colo.

[73] Assignee: Storage Technology Corporation, Louisville, Colo.

[21] Appl. No.: 696,357

[22] Filed: May 6, 1991

[51] Int. Cl.$^5$ .............................................. G11C 5/06
[52] U.S. Cl. ............................ 365/64; 365/159.01; 365/189.04; 365/198; 365/215; 365/226; 365/228; 365/229
[58] Field of Search ............... 365/64, 189.01, 189.04, 365/198, 215, 226, 228, 229

[56] References Cited

U.S. PATENT DOCUMENTS 3,609,711  9/1971  Gunn ................................. 365/64
4,985,870  1/1991  Faraci ............................... 365/228

FOREIGN PATENT DOCUMENTS 59-113581  6/1984  Japan ................................ 365/64

Primary Examiner—Robert J. Pascal
Assistant Examiner—R. A. Ratliff
Attorney, Agent, or Firm—Duft, Graziano & Forest

[57] ABSTRACT

The solid state memory device consists of a circuit board based system which is mounted in a 3480 type magnetic tape cartridge form factor housing to make this media physically compatible with the 3480 type magnetic tape cartridges. The interconnection of the solid state memory device with the read/write device is by an optical connections which transfer data between the solid state memory device and the associated read/write device. A plurality of batteries in the solid state memory device provide power for the memory retention capability required of the volatile solid state memory devices. The batteries are recharged by the use of a pair of power rails that are incorporated into the exterior housing of the 3480 form factor cartridge. Thus, the associated read/write device applies power to the solid state memory via these power rails when the 3480 form factor cartridge is placed in the associated read/write device. Likewise, an associated manual or automated cartridge storage system supplies power when the cartridge is offline, in storage.

22 Claims, 4 Drawing Sheets

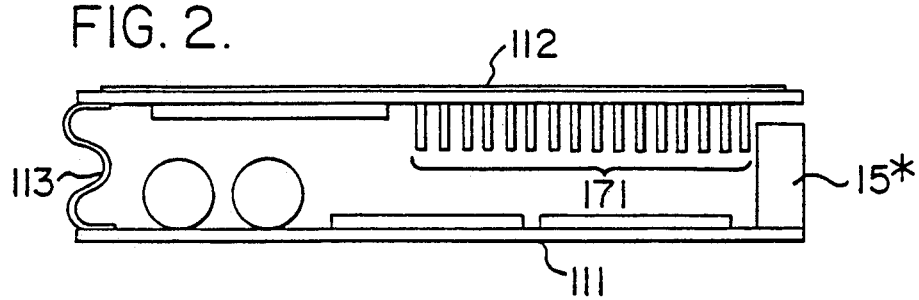
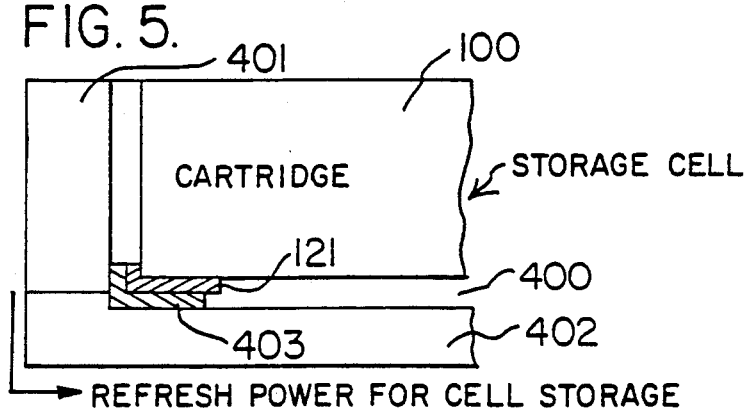
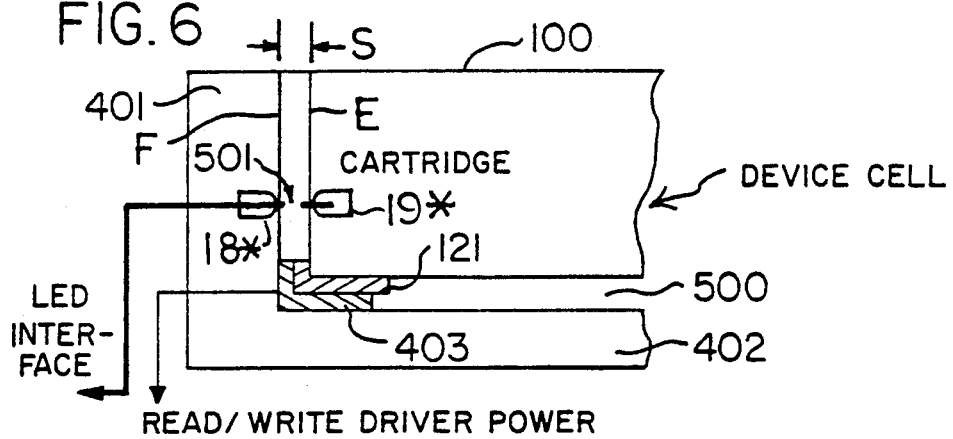
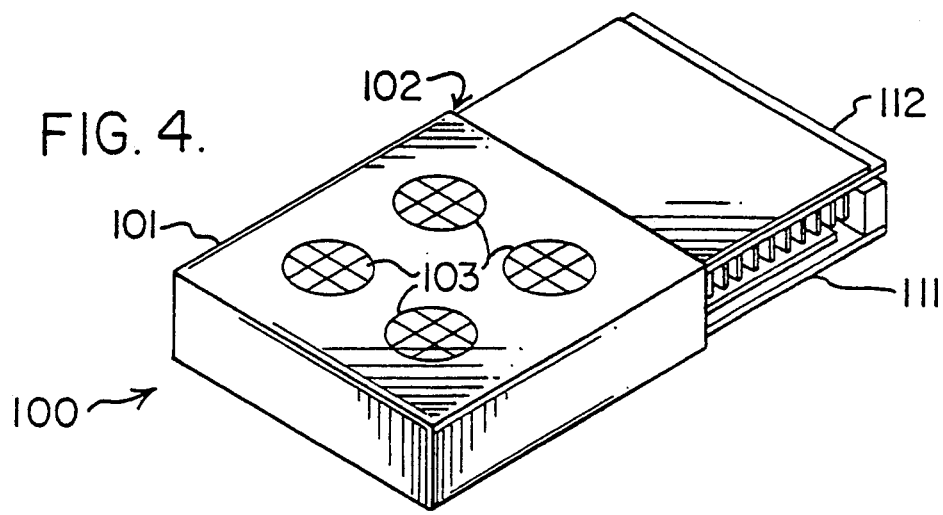

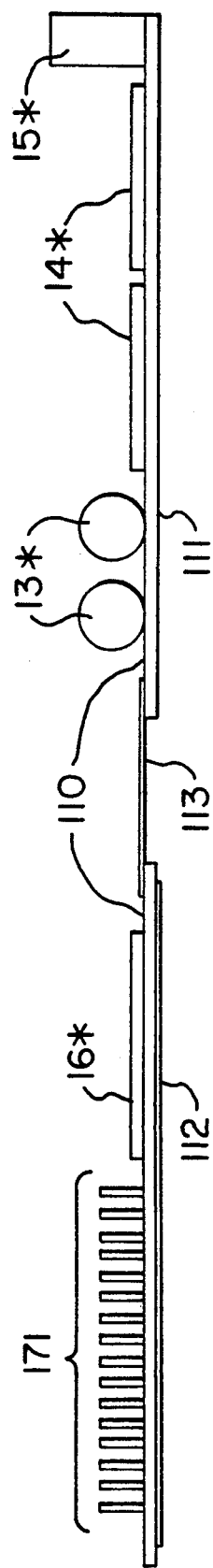

SOLID STATE MEMORY DEVICE HAVING OPTICAL DATA CONNECTIONS

FIELD OF THE INVENTION

This invention relates to solid state memory and, in particular, to a semiconductor solid state memory device that is configured in a 3480 type magnetic tape cartridge form factor. This semiconductor solid state memory device is equipped with an optical connection to enable the solid state memory device to be linked with a read/write device to transfer data between the solid state memory device and the read/write device.

PROBLEM

It is a problem in the field of data storage systems to produce a memory device that is both mountable on a read/write device and that has a fast data access time. Memory devices can be segmented into two broad categories: removable and fixed. The fixed memory devices are those that are permanently attached to a read/write device such that they are directly connected to an associated data processing system at all times. In this configuration, solid state memory devices provide very fast memory access times but such systems are typically very expensive and therefore only a limited memory capacity of this form can be provided for the associated data processing system.

Solid state memory devices are not removable because they require an electrical connection to interconnect the solid state memory device with an associated read/write device. The typical electrical connector useable with a solid state memory device may have a reliable insertion lifetime of only fifty to one hundred times before the electrical contacts suffer mechanical wear and begin to introduce errors in the data read to or from the associated device. In addition, currently available, high performance, semiconductors solid state memory is a volatile media that requires a continual source of power for memory retention. Demounting the solid state memory device from the read/write device (its power source) would cause memory loss.

In the field of removable data storage devices, magnetic tape and floppy disks are the predominant media in use due to the fact that they are non-volatile media and can be read and written many times without suffering degradation in the data transfer between the magnetic media and the associated read/write device. Another advantage of magnetic media is that no electrical connection is required between the media and the associated read/write device. The read/write device magnetically interacts with the data storage media and the only wear factor is that of the media housing and the device's mechanical transport mechanisms. This longevity of use has made magnetic media the media of choice and, in particular, magnetic tape cartridges in the 3480 form factor represent the vast majority of removable data storage media. The difficulty with magnetic tape media is that the data transfer rate is significantly less than that of solid state memory devices.

Therefore, there is presently no removable media that has a data transfer rate comparable to that of solid state memory nor is there a practical removable, non-volatile, solid state memory device.

SOLUTION

The above described problems are solved and a technical advance achieved in the field by the solid state memory device having optical data connections. This solid state memory device consists of a circuit board which is mounted in a 3480 type magnetic tape cartridge form factor housing to make this media physically compatible with 3480 type magnetic tape cartridges. Thus, the solid state memory device can be placed either in a manual or an automated cartridge library system for storage, retrieval and mounting on an associated read/write device such as presently available for 3480 type magnetic tape cartridges. The problem of electrically interconnecting the solid state memory device with the read/write device has been solved by the use of an optical data connection which provides a mechanism for transferring data between the solid state memory device and the associated read/write device. A power source, in the form of a plurality of batteries, on the solid state memory device provides power for the memory refresh capability required of the volatile semiconductor solid state memory devices. The batteries are recharged by the use of a pair of power rails that are incorporated into the exterior housing of the 3480 type form factor cartridge. Thus, the associated read/write device applies power to the solid state memory device via this source when the 3480 type form factor cartridge is placed in an associated read/write device or a cartridge library system storage location. The batteries in this solid state memory device ensure continuous power to the memory devices contained on the circuit board during power interruptions and during the transportation of the 3480 type form factor cartridge from the associated read/write device to a storage location within an automated or manual cartridge library system. Thus, the use of the electrical connectors with the mechanical degradation associated therewith has been avoided by the use of the optical connections to transfer data to and from the solid state memory and a battery based power source is provided internal to the cartridge in order to provide continuous power to the memory devices when the cartridge is being transported between its storage location and the associated read/write device. Thus, this configuration provides a practical solution for a removable solid state memory device.

BRIEF DESCRIPTION OF THE DRAWING

FIG. 2 illustrates a side view of the solid state memory device in cut away view;

FIG. 3 illustrates a side view of the solid state memory device with the circuit boards unfolded and extended;

FIG. 4 illustrates a perspective view of the solid state memory device;

FIG. 5 illustrates a side view of the solid state memory device power rail arrangement when inserted in a storage rack;

FIG. 6 illustrates the solid state memory device power rail arrangement when the solid state memory device is inserted in the read/write device.

DETAILED DESCRIPTION

Figure 1:
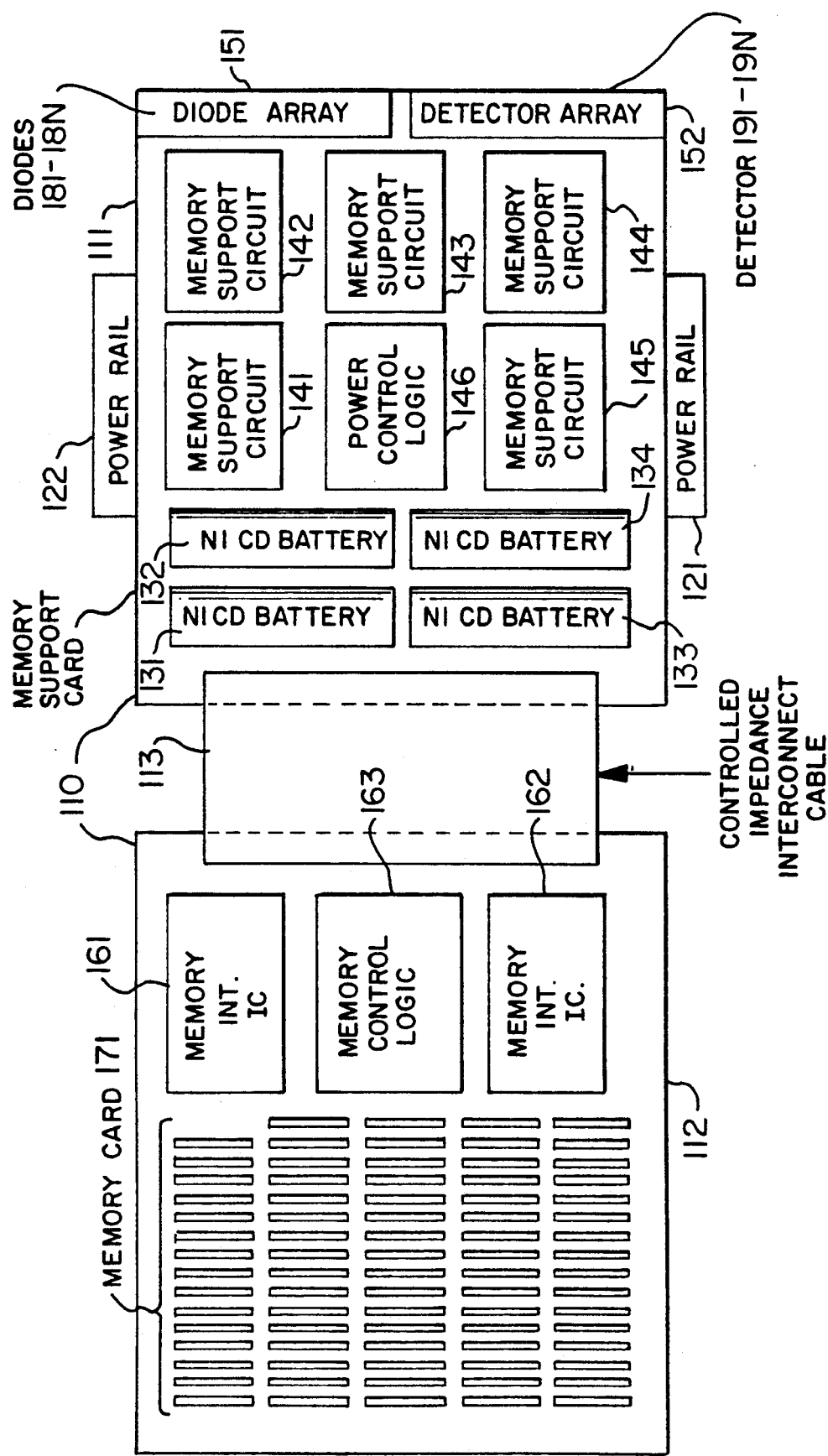
FIG. 1 illustrates a top view of the circuit boards of the solid state memory device.

The solid state memory device 100 of the present invention, as illustrated in FIGS. 1-4, consists of a plurality of volatile random access memory devices 171 mounted on a circuit board 110 which consists of two individual segments 111, 112. These random access memory devices 171 are interconnected with an associated read/write device by means of optical transceivers 151, 152, mounted on the printed circuit board 111, which communicate with corresponding optical transceivers in the read/write device (not shown). Power is provided to the circuit board 111, 112 by means of a power interconnection 121, 122 which supplies power to the random access memory devices 171 when the circuit board 111, 112 is inserted into the read/write device or into its storage location. Additionally, batteries 131-134 are provided on the printed circuit board 111, 112 in order to provide hold over power for the random access memory devices 171 when the circuit board 111, 112 is in transit between a storage location and the read/write device.

In order to simplify the handling of the solid state memory device 100, it is shown packaged in an industry-standard form factor 3480 type magnetic tape cartridge housing 101. This is a standard form factor used for magnetic tape media and can be handled by automated library systems. Exterior housing 101 consists of a fixed housing body one end 102 of which is open to provide the read/write device with optical access to transceivers 151, 152. A typical automated magnetic tape cartridge library system is the 4400 Automated Cartridge Library System (4400 ACS) manufactured by Storage Technology Corporation. This automated cartridge library system robotically stores and retrieves a plurality of 3480 type magnetic tape cartridges for a plurality of read/write devices. The use of this standard media form factor enables the solid state memory devices to be used within an automated cartridge library in a manner analogous to that of the magnetic tape cartridges to be robotically stored, retrieved and mounted on the read/write device independent of operator intervention.

The solid state memory device architecture illustrated herein makes use of the 3480 type cartridge housing 101 to enclose the solid state memory of the present invention. The preferred embodiment of the solid state memory device illustrated herein consists of two printed circuit boards 111, 112 (of typically uniform dimensions) which are interconnected by means of a flexible cable 113 in order that the circuit boards 111, 112 can be placed one on top of the other in juxtaposed position for insertion into the housing 101. These circuit boards 111, 112 include a plurality of memory devices 171 such as volatile or non-volatile semiconductor random access memory devices for storing data thereon. In addition, there are a plurality of memory interface circuits 161-163 and memory control circuits 141-145 which operate in well known fashion to regulate the access to the data stored on the plurality of semiconductor random access memory devices 171. These memory interface and control circuits 161-163, 141-145 are well known and operate in standard fashion in order to enable a read/write device to store and retrieve data on the semiconductor random access memory devices 171.

The significant departure from the prior art solid state memory devices is the removable nature of this solid state memory device 100, wherein the solid state memory device 100 can be stored off line in its housing in a manually loaded rack or within a storage location in an automated cartridge library system. When this particular memory device needs to be accessed by an associated data processor, the automated cartridge library system (or the operator in the manual handing case), retrieves the solid state memory device 100 from its storage location and transports it to the designated read/write device where it is loaded for data access by the associated data processor.

Figure 7:
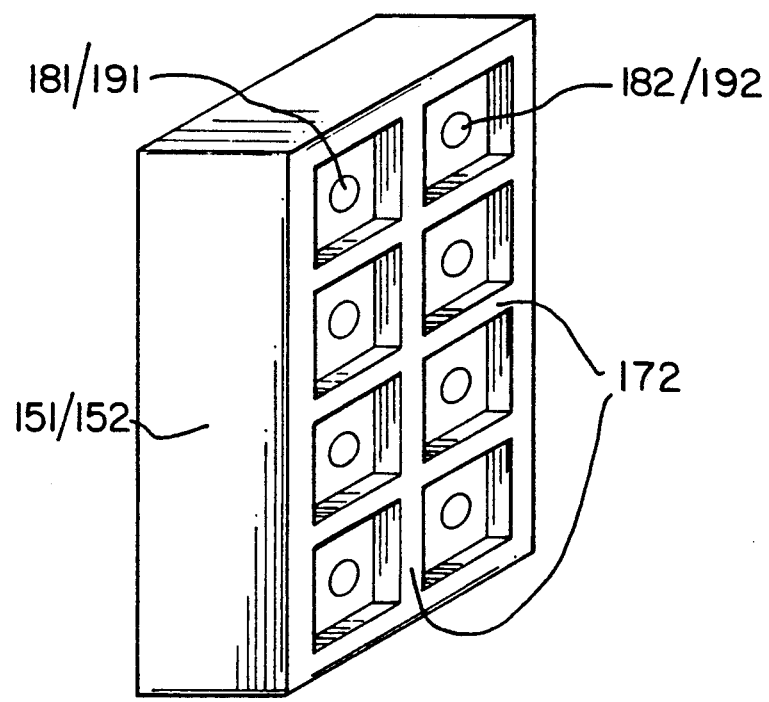
FIG. 7 illustrates a perspective view of the optical transmitter or detector block partitioning.

A mechanically-based electrical connector of conventional design can not be used to interface the solid state memory device 100 with the associated read/write device because of the limited lifetime expected of these connectors. Repeated mounting and dismounting of the solid state memory device 100 from the associated read/write device would cause the connector to wear and fail, thereby causing the loss of the data that is stored on the solid state memory device 100. In order to overcome this limitation, a set of optical transceivers 151, 152 is provided on the solid state memory device 100 in order to enable reliable data transfer between the solid state memory device 100 and the associated read/write device. As illustrated, the transceivers 151, 152 comprise a plurality of light emitting diodes 181-188 or laser diodes for transmitting data from the solid state memory device 100 to an associated read/write device. A set of optical detectors 191-198 is also provided to receive data transmitted from the read/write device. This loose optical coupling reduces the need for precise alignment of the solid state memory device 100 when inserted in the read/write device. As can be seen from the transceiver configuration, each optical receiver or transmitter is separated from the adjacent one by a partition 172 shown in FIG. 7 in order to prevent cross coupling of the optical signals therebetween. Furthermore, the light emitting diodes 181-188 that are selected for these transceivers 151, 152 produce a narrow beam of light with low divergence (less than 7°) in order to provide a focussed transmission to the associated optical detector 191-198. Such a configuration prevents crosstalk between adjacent transceiver pairs.

FIG. 6 illustrates the solid state memory device 100 inserted in a read/write device 401. In a typical situation wherein each adjacent light emitting diode 18* is separated by approximately ⅜ inch (center-to-center) and associated optical detectors 19* also have the same separation from each other, end E of solid state memory device 100 can be spaced more than three inches from front end F of read/write device 401. This spacing S assumes that light emitting diodes 18* and associated optical detectors 19* are located in proximity to ends E and F, respectively. The allowable spacing S between E and F of LED interface 501 can be calculated by using common trigonometry:

$$S = \frac{d/2}{\tan(b/2)} = \frac{3/16 \text{ inch}}{\tan(3.5 \text{ deg.})} = 3\frac{1}{8} \text{ inches}$$

ps where:
d = separation between LEDs (center-to-center)
b = beamwidth of LED

Therefore, given that adjacent LEDs are separated by ⅜ inch, and an LED beamwidth of 7 degrees, spacing S is equal to approximately 3⅛ inches. The above calculation is a worst-case scenario, wherein there is nearly zero crosstalk between adjacent LEDs. It is clear that the distance S can be further extended if small amounts of crosstalk can be tolerated or eliminated (via noise reduction techniques). Thus it can be seen that the present system loosely couples the transmitting and receiving LED (transceiver) pairs so that they can be spaced substantially apart without requiring a rigid coupling therebetween. Note that the ⅜ inch separation between adjacent light emitting diodes 18* and between associated optical detectors 19* is arbitrary and that a greater maximum spacing S is achieved if the separation is increased. The use of laser diodes (as previously referred to) having less than the 7 degree LED beamwidth would allow an even greater spacing S between ends E and F of memory device 100 and read/write device 401. These transceivers 151, 152 operate at a high enough frequency (200 Mb/sec) and a sufficient number are provided in parallel in order to provide a data transfer rate between solid state memory device 100 and the associated read/write device that is commensurate with that expected of conventional wire connected solid state memory.

In order to provide power to these volatile memory devices 171 on the solid state memory device 100, a power interconnection 121, 122 is provided to an external source of power. This interconnection can be as simple as a pair of power rails 121, 122 located on the exterior housing (or on the circuit board 111, 112 if no exterior housing is used) to interconnect with an associated pair of rails or contacts 403 in the associated read/write device 500 or storage location 400 to supply power to the solid state memory device 100. These power rails 121, 122 are wired to the printed circuit boards 111, 112 that contain the random access memory devices 171. As illustrated in FIGS. 5 and 6, when the solid state memory device 100 is placed into the storage location 400 or the associated read/write device 500, the power rails 121, 122 contact electrical connections 403 contained in the storage location 400 or read/write device 500 in order to provide power to the solid state memory device 100. In the case of the associated read/write device 500, not only is there a connection to the power rails 121, 122, but optical transceivers 501 located within the read/write device 500 are aligned with the transceivers 151, 152 on the solid state memory device 100 in order to exchange data therebetween.

In additional to the external source of power, the solid state memory device 100 contains a plurality of batteries 131-134 to provide power to the volatile semiconductor memory devices 171 located on the circuit boards 111, 112 during transit between the storage location 400, within for example the automated cartridge library system, and the mounted position in the read/write device 500. This transit time typically is on the order of a few seconds but could be longer, especially in the case where the solid state memory device 100 is manually loaded in a read/write device 500 by an operator or transported external to the automated cartridge library. These batteries 131-134 provide hold over power for the volatile random access memory devices 171 in the solid state memory device 100 and are themselves recharged by the source of external power via power control circuit 146 once the solid state memory device 100 is placed in its storage location 400 or read/write device 500. Furthermore, an auxiliary source of power can be provided by installing a plurality of photovoltaic elements 103 in the exterior housing 101 to provide a source of recharge current for batteries 131-134 When the solid state memory device 100 is removed from its storage location 400 or read/write device 500 for an extended period of time.

While a specific embodiment of this invention has been disclosed, it is expected that those skilled in the art can and will design alternate embodiments of this invention that fall within the scope of the appended claims.

I claim:

1. A removable solid state memory device, for removably inserting into a mating data read/write device to read data from said solid state memory device and write data thereon, comprising: carrier means for mounting thereon a plurality of circuit elements; a plurality of solid state memory devices mounted on said carrier means; battery means mounted on said carrier means for supplying power to said solid state memory devices;

optical transceiver means connected to said solid state memory devices for reading/writing data thereon as optically transmitted between said optical transceiver means and said read/write device; and storage cell means for charging said battery means from an external power source when said solid state memory device is located external to said mating data read/write device.

2. The memory device of claim 1, wherein said optical transceiver means contains a plurality of optical transceivers and wherein said removable solid state memory device is loosely coupled to said mating data read/write device to allow an operative distance of up to approximately 3 inches therebetween when each of said optical transceivers has a beamwidth of approximately 7 degrees and is separated from each adjacent one of said optical transceivers by approximately ⅜ inch center-to-center.

3. The apparatus of claim 1 wherein said charging means includes:

means for electrically coupling a charging current from a source of power, located external to said solid state memory element and in said read/write device, to said battery means to charge said battery means when said solid state memory element is inserted into said read/write device to exchange data between said read/write device and said solid state memory element.

4. The apparatus of claim 1 wherein said charging means includes:

power rails mounted on said carrier means for electrically contacting mating power source contacts, carrying a source of power to charge said battery means, mounted in said read/write device in a position to engage said power rails when said solid state memory device is inserted into said read/write device.

5. The apparatus of claim 1 wherein said solid state memory device includes:

exterior housing means, having predetermined exterior dimensions, to present a uniform physical data storage element image to said read/write device and having an opening in one end thereof;

power rails mounted on said exterior housing means for electrically contacting mating power source contacts, carrying a source of power to charge said battery means, mounted in said read/write device in a position to engage said power rails when said solid state memory device is inserted into said read/write device.

6. The apparatus of claim 5 wherein said optical transceiver means is mounted on said carrier means adjacent to and optically directed at said opening in said exterior housing means and includes:

a plurality of transmitter means, each producing a beam of modulated light for transmitting data from said solid state memory devices to said read/write device, which beam of light has a narrow field of divergence to permit loose coupling between said plurality of transmitter means and said read/write device.

7. The apparatus of claim 5 wherein said optical transceiver means is mounted on said carrier means adjacent to and optically directed at said opening in said exterior housing means and includes:
  a plurality of receiver means, each receptive to a beam of light modulated to transmit data from said associated read/write device to said solid state memory devices, which beam of light has a narrow field of divergence, for storing said received data in said solid state memory devices.

8. The apparatus of claim 1 wherein said solid state memory device includes:
  at least one photovoltaic means for charging said battery means from ambient light received by said photovoltaic means.

9. The apparatus of claim 1 wherein said charging means includes:
  means for electrically coupling a charging current from a source of power, located external to said solid state memory element and in a cartridge storage apparatus, to said battery means to charge said battery means when said solid state memory element is inserted into said cartridge storage apparatus for storage.

10. The apparatus of claim 1 wherein said charging means includes:
  power rails mounts on said carrier means for electrically contacting mating power source contacts, carrying a source of power to charge said battery means, mounted in a cartridge storage apparatus in a position to engage said power rails when said solid state memory device is inserted into said cartridge storage apparatus.

11. The apparatus of claim 1 wherein said solid state memory device includes:
  exterior housing means, having predetermined exterior dimensions, to present a uniform physical data storage element image to said read/write device, and having an opening in one end thereof;
  power rails mounted on said exterior housing means for electrically contacting mating power source contacts, carrying a source of power to charge said battery means, mounted in a cartridge storage apparatus in a position to engage said power rails when said solid state memory device is inserted into said cartridge storage apparatus.

12. The apparatus of claim 1 wherein said optical transceiver means includes:
  a plurality of transmitter means, each producing a beam of modulated light for transmitting data from said solid state memory devices to said associated read/write device, which beam of light has a narrow field of divergence to permit loose coupling therebetween.

13. The apparatus of claim 1 wherein said optical transceiver means includes:
  a plurality of receiver means, each receptive to a beam of light modulated to transmit data from said associated read/write device to said solid state memory devices, which beam of light has a narrow field of divergence, for storing said received data in said solid state memory devices.

14. A data storage element for housing solid state memory in an optical connectorized media format for handling by a robotic data storage and retrieval system comprising:
  exterior housing means having predetermined exterior dimensions, to present a uniform physical data storage element image to said robotic data storage and retrieval system, and having an opening in one end thereof;
  carrier means located within said exterior housing means for mounting thereon a plurality of circuit elements; a plurality of solid state memory devices mounted on said carrier means;
  battery means mounted on said carrier means for supplying power to said solid state memory devices; optical transceiver means mounted on said carrier means and optically facing said opening, connected to said solid state memory devices for reading/writing data thereon as optically transmitted into said opening between said optical transceiver means and said read/write device; and
  means for charging said battery means from a power source located external to said exterior housing of said solid state memory element.

15. The apparatus of claim 14 wherein said charging means includes:
  power rails mounted on a surface of said exterior housing means for electrically contacting mating power source contacts, carrying a source of power to charge said battery means, mounted in said read/write device in a position to engage said power rails when said solid state memory element is inserted into said read/write device.

16. The apparatus of claim 14 wherein said charging means includes:
  means for electromagnetically coupling a charging current from a source of power, located external to said solid state memory element exterior housing means and in said read/write device, to said battery means to charge said battery means when said solid state memory element is inserted into said read/write device to exchange data between said read/write device and said solid state memory element.

17. The apparatus of claim 14 wherein said optical transceiver means includes:
  a plurality of transmitter means, each producing a beam of modulated light for transmitting data from said solid state memory devices to said associated read/write device, which beam of light has a narrow field of divergence to permit loose coupling between said plurality of transmitter means and said associated read/write device.

18. The apparatus of claim 14 wherein said optical transceiver means includes:
  a plurality of receiver means, each receptive to a beam of light modulated to transmit data from said associated read/write device to said solid state memory devices, which beam of light has a narrow field of divergence, for storing said received data in said solid state memory devices.

19. The apparatus of claim 14 wherein said solid state memory device includes:
  at least one photovoltaic means for charging said battery means from ambient light received by said photovoltaic means.

20. The apparatus of claim 14 wherein said charging means includes:
  power rails mounted on a surface of said exterior housing means for electrically contacting mating power source contacts, carrying a source of power to charge said battery means, mounted in a cartridge storage apparatus in a position to engage said power rails when said solid state memory element is inserted into said cartridge storage apparatus.

21. The apparatus of claim 14 wherein said charging means includes:
    means for electrically coupling a charging current from a source of power, located external to said solid state memory element exterior housing means and in a cartridge storage apparatus, to said battery means to charge said battery means when said solid state memory element is inserted into said cartridge storage apparatus.

22. A removable solid state memory element, for removably inserting into a mating data read/write device to read data from said solid state memory element and write data thereon, comprising:
    carrier means for mounting thereon a plurality of devices;
    a plurality of solid state memory devices mounted on said carrier means;
    battery means mounted on said carrier means for supplying power to said solid state memory devices; and
    optical transceiver means connected to said solid state memory devices for reading/writing data thereon as optically transmitted between said optical transceiver means and said read/write device, including:
        a plurality of transmitter means, each producing a beam of modulated light for transmitting data from said solid state memory devices to said associated read/write device, which beam of light has a narrow field of divergence,
        a plurality of receiver means, each receptive to a beam of light modulated to transmit data from said associated read/write device to said solid state memory devices, which beam of light has a narrow field of divergence, for storing said received data in said solid state memory devices;
    means for charging said battery means from a power source located external to said solid state memory element, including:
        power rails mounted on an exterior surface of said solid state memory element for electrically contacting mating power source contacts, carrying a source of power to charge said battery means, mounted in said read/write device in a position to engage said power rails when said solid state memory element is inserted into said read/write device.

* * * * *